United States Patent
Sasaki et al.

(10) Patent No.: US 6,612,024 B1
(45) Date of Patent: Sep. 2, 2003

(54) METHOD OF MOUNTING A DEVICE TO A MOUNTING SUBSTRATE

(75) Inventors: Dai Sasaki, Tokyo (JP); Tohru Terasaki, Aiichi (JP); Masuo Kato, Aiichi (JP); Masami Tsurumi, Aiichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/561,941

(22) Filed: May 1, 2000

(30) Foreign Application Priority Data

May 13, 1999 (JP) ............................. 11-132104

(51) Int. Cl.$^7$ ................................. H05K 3/32
(52) U.S. Cl. ........................ 29/840; 29/739; 29/841; 29/832; 257/775; 257/737; 257/738; 257/772; 257/773; 257/778; 174/260; 361/768; 361/773; 361/774
(58) Field of Search ................ 29/849, 841, 739; 228/180.22; 259/772, 773, 775, 737, 738, 778; 361/768, 773, 774; 174/260

(56) References Cited

U.S. PATENT DOCUMENTS

| | | | | |
|---|---|---|---|---|
| 3,373,481 A | * | 3/1968 | Lins et al. | 174/257 |
| 5,874,780 A | * | 2/1999 | Murakami | 29/841 |
| 5,889,326 A | * | 3/1999 | Tanaka | 257/737 |
| 6,081,997 A | * | 7/2000 | Chia et al. | 264/272.17 |

* cited by examiner

*Primary Examiner*—Richard Chang
(74) *Attorney, Agent, or Firm*—Sonnenschein, Nath & Rosenthal

(57) ABSTRACT

A semiconductor device with bump electrodes having acutely shaped tips and method of mounting same. The bump electrodes are brought into contact with respective portions of a conductive pattern of a mounting substrate without any foreign matter between the tips of the bump electrodes and the respective portions of the conductive pattern. Thereafter, sealing material is allowed to surround the bump electrodes.

4 Claims, 6 Drawing Sheets

METHOD OF MOUNTING A DEVICE TO A MOUNTING SUBSTRATE

RELATED APPLICATION DATA

The present application claims priority to Japanese Application No. P11-132104 filed May 13, 1999 which application is incorporated herein by reference to the extent permitted by law.

BACKGROUND OF THE INVENTION

1. Field of the Invention

The present invention relates to a mounting structure of a semiconductor device, and a process for mounting a semiconductor device on a mounting substrate such as a printed circuit board having conductor patterns on which the semiconductor device with a plurality of bump electrodes is mounted.

2. Description of the Related Art

Conventionally, a flip chip bonding process is widely employed, where a semiconductor device is mounted on a printed circuit board (as a mounting substrate) by a facedown bonding method. In this mounting process, as shown in FIG. 9, a plurality of bump electrodes 14 having end surfaces 14A as shown in the figure are bonded on aluminum electrode pads 12 provided on a semiconductor device 10.

After the bump electrode 14 is bonded on the aluminum electrode pad 12, each tip of the bump electrode 14 of the semiconductor device is subject to a leveling process by a leveler made of a material such as brass, so that all end surfaces 14A have the same height and have relatively large area as shown in FIG. 9. The leveling process is done with a load weight approximately expressed by N×50 gram-force, where the N is the number of bonding pads formed on the semiconductor device 10.

Then as shown in FIG. 10, when the semiconductor device 10 is mounted on a printed circuit board 20, the bump electrode 14 of the semiconductor device 10 is positioned to conductor patterns 22 formed on the printed circuit board 20. Then heat and pressure are added to the bump electrode 14 from backside of the semiconductor device 10, thereby the bump electrode 14 is bonded on the conductor pattern 22 of the printed circuit board 20.

A filler 30 of thermosetting resin is filled between the semiconductor device 10 and the printed circuit board 20 to seal gaps there-between.

In this conventional method of mounting a semiconductor device on a printed circuit board as above described, there is a defect that foreign body such as a resin particle or something like that is easily put between the end surface 14A (top surface) and the conductor pattern 22 of the printed circuit board 20 during the mounting process. Resultantly, the reliability of a semiconductor mounting process is degraded. For example, the foreign body undesirably put therebetween deteriorates contact condition of the end surface 14a with the conductor pattern 22, and this degrades reliability and productivity of a final product that is installed thus processed printed circuit board.

SUMMARY OF THE INVENTION

An object of the invention is to provide a mounting structure of a semiconductor device, and a process for mounting a semiconductor device on a mounting substrate such as a printed circuit board having conductor patterns on which the semiconductor device with a plurality of bump electrodes is mounted.

Another object of the present invention is to provide a new mounting structure of a semiconductor device, and a process for mounting a semiconductor device on a printed circuit board, wherein it is avoided for foreign bodies such as resin particles to be put between a bump electrode of the semiconductor device and a conductor pattern of the printed circuit board.

Further another object of the present invention is to provide a new mounting structure of a semiconductor device, and a process for mounting a semiconductor device on a mounting substrate, wherein there is formed a bump electrode having an acute tip such as cone-shaped top on the semiconductor device to be mounted on the printed circuit board by a facedown bonding method.

In order to over the above-described defects which existed in the conventional mounting structure, it is proposed a new mounting structure, wherein there is provided an acute tip at each bump electrode of a semiconductor device when mounting the semiconductor device having a plurality of bump electrodes on a mounting substrate having conductor patterns.

These acute tips of the bump electrodes are slightly made flat by a leveler with a relatively light load weight, then depressed slowly on the conductor patterns of the mounting substrate with heat and pressure. Resultantly, each bump electrode and conductor pattern are joined with face contact by gradually transforming the shape of the bump electrode including the acute tip thereof.

In the process of mounting a semiconductor device having a plurality of bump electrodes on the conductor pattern of the mounting substrate according to the present invention, the process comprises the steps of a bonding step for providing a plurality of bump electrodes having acute tip on electrode pads of the semiconductor device, a leveling step for slightly making flat the acute tip of the bump electrodes by a leveler with relatively light load weight, a positioning step for positioning the tip of the bump electrode on the conductor pattern of the mounting substrate, and a mounting step for depressing the tip of the bump electrode against the conductor pattern slowly with heat and load weight. During this mounting step, the bump electrode and the conductor pattern of the mounting substrate are bonded with face contact while transforming shape of the bump electrode gradually.

In the mounting structure for the semiconductor device according to the present invention, each bump electrode of the semiconductor device has an acute tip formed on top of the bump electrode before mounting. Each acute tip of the bump electrode is preferably flattened slightly with relatively light load weight. And the tip of the bump electrode is positioned on the conductor pattern of the printed circuit board and pressed slowly against the conductor pattern with pressure and heat. Each tip of the bump electrode is gradually transformed and joined to the conductor electrode with face contact.

According to the present invention, each tip of the bump electrode has only small top surface before mounting, so that during mounting process it is avoidable to put foreign body between the bump electrode and the conductor pattern of the printed circuit board.

Namely the tip of bump electrode is gradually transformed by being pressed against the conductor pattern of the mounting substrate, and this transformation of the bump electrode pushes out foreign body existed between the bump electrode and conductor pattern from inside to outside, and finally the bump electrode is transformed as to perform a face contact with the conductor pattern while excluding foreign body.

Therefore, foreign bodies are seldom put between the conductor pattern and the bump electrode.

According to the present invention, it is easily performed to obtain a good contact condition between the bump electrode and the conductor pattern, and thereby a reliability and productivity of a final product are improved.

In the method for mounting the semiconductor device on the mounting substrate according to the present invention, at first a plurality of bump electrodes having acute tip is provided on each of an electrode pad formed on a semiconductor device at a bonding process. In the following leveling step, each tip of the bump electrode is flattened slightly by a leveler with a light load weight. Then each tip of the bump electrode of the semiconductor device is positioned on a conductor pattern of a mounting substrate in a positioning step. Then the semiconductor device is depressed against the mounting substrate with load weight and heat in a next mounting step. In this mounting step, each top of the bump electrode is slowly depressed on the conductor pattern of the mounting substrate, and is gradually transformed so as to perform face contact condition between the transformed bump electrode and the conductor pattern.

In order to make an acute tip at each top of the bump electrode, a conglobation is formed at an end of a gold wire having a diameter of about 25 µm by an electric discharging at first. Then thus formed conglobation of the gold wire is depressed on the aluminum electrode pad 112 with an ultrasonic heating for making alloy of gold and aluminum, and after that the gold wire is pulled off as to form the acute tip on the bump electrode.

PREFERRED EMBODIMENTS OF THE INVENTION

Preferred embodiments of a mounting structure and a process for mounting a semiconductor device will be described in detail below with reference to the accompanied drawings. In one example of the present invention, a flip chip mounting process wherein a semiconductor device is mounted a printed circuit board in a face down condition is explained.

Figure 1:
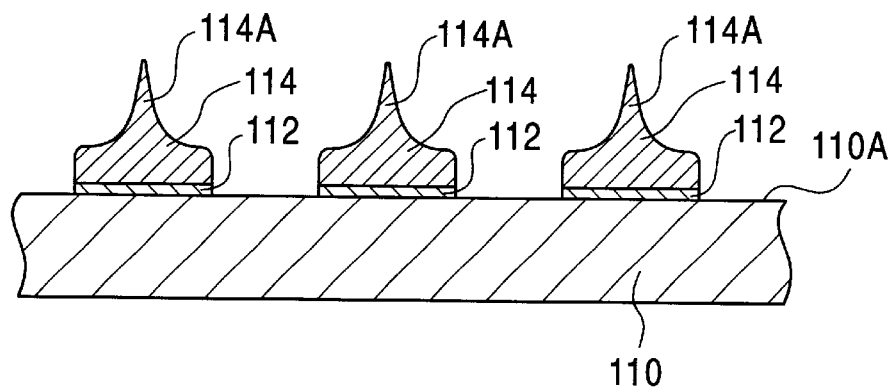
FIG. 1 is a schematic cross sectional view of a semiconductor device used in a mounting structure and a mounting process of the present invention.
Figure 6:
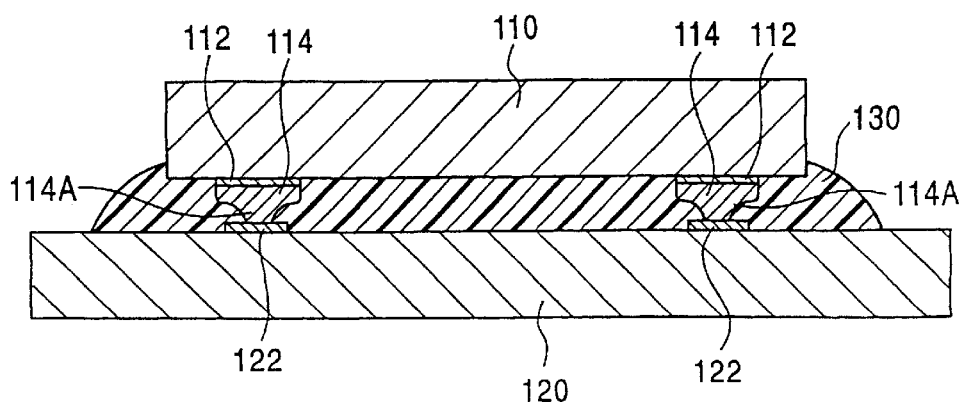
FIG. 6 is a schematic cross sectional view showing a mounting step for mounting the semiconductor device in FIG. 1 and the printed circuit board in FIG. 4.

FIG. 1 through to FIG. 6 are schematic cross sectional views for explaining one example of a mounting structure and a mounting process of a semiconductor device on a mounting substrate, and a mounting structure of a semiconductor device of the present invention is explained at first.

A semiconductor device 110 of this embodiment has a plurality of aluminum electrode pads 112 formed on a surface 110A of the semiconductor device 110. A bump electrode 114 is bonded on each of the aluminum electrode pad 112. This bump electrode 114 is made of conductive material having characteristics such as plastic and heat deposition. One example of this material is gold (Au). Each bump electrode 114 is provided a cone shaped acute tip 114A.

This acute tip 114A is formed as follows. Namely, a conglobation is formed at an end of a gold wire having a diameter of about 25 µm by an electric discharging at first. Then thus formed conglobation of the gold wire is depressed on the aluminum electrode pad 112 with an ultrasonic heating for making alloy of gold and aluminum, and after that the gold wire is pulled off as to form the acute tip 114A on the bump electrode 114.

Figure 2:
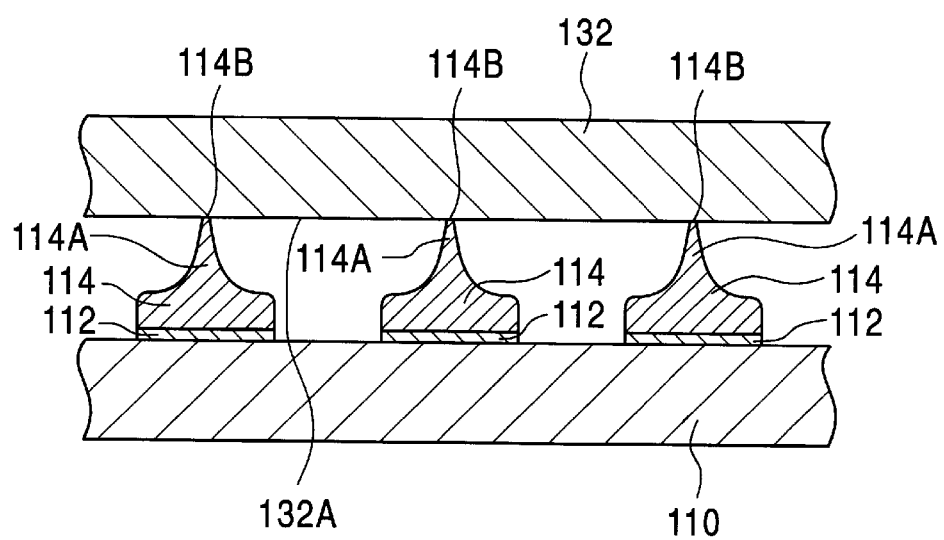
FIG. 2 is a schematic cross sectional view showing a leveling process for a tip of a bump electrode of the semiconductor device shown in FIG. 1.

FIG. 2 shows a leveling process applied to the tip 114A of the bump electrode 114 of the semiconductor device 110. In case of this example, thus formed acute tip 114A of the bump electrode 114 is treated a leveling process slightly with a light load weight by a flat surface 132A of a brass leveler 132. Preferably a load weight is N×(4~5) gram-force, where N is the number of the tips 114A of the bump electrodes 114 formed on the semiconductor device 110.

Figure 3:
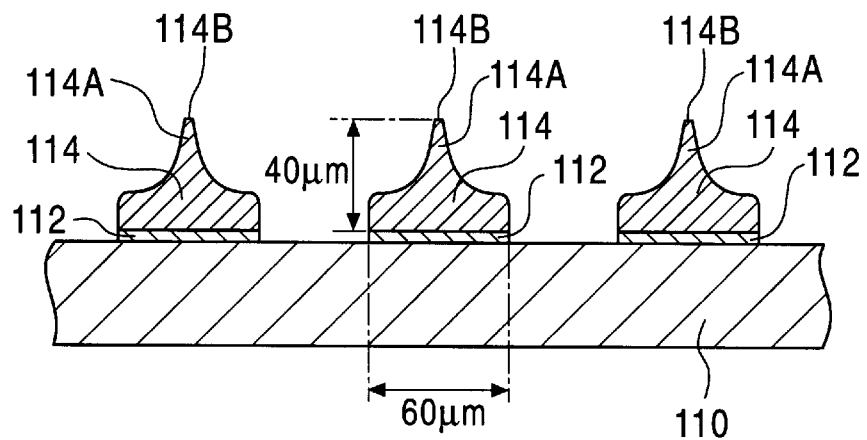
FIG. 3 is a schematic cross sectional view of the bump electrode of the semiconductor device shown in FIG. 1.

After this process, there is formed a small flat surface 114B at each tip 114A of the bump electrode 114 as shown in FIG. 3. The size of the small flat surface 114B is 5 to 10 µm as a diameter. Namely, as shown in FIG. 3, each bump electrode 114 has a size of about 60 µm at bottom, 5 to 10 µm at top and about 40 µm in height after the leveling process.

According to the present invention, each tip 114A of the bump electrode 114 has only small flat surface 114B before mounting as described above, so that during mounting process it is avoidable to put foreign body between the bump electrode 114 and a conductor pattern of a printed circuit board.

Figure 4:
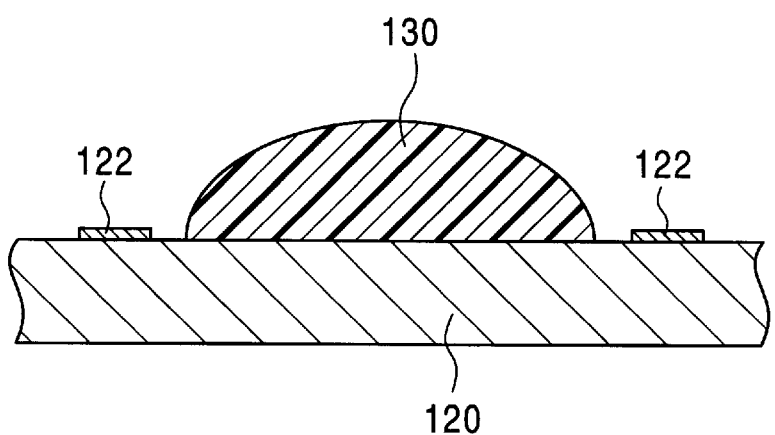
FIG. 4 is a schematic cross sectional view of one example of a printed circuit board to be used in a mounting structure and a mounting process of a semiconductor device according to the present invention.

FIG. 4 shows one example of a printed circuit board 120 on which the semiconductor device 110 is mounted. And as shown in this figure, on a surface of the printed circuit board 120, there is formed a conductor pattern 122 on which the semiconductor device 110 is mounted. Further there is provided a filler (sealing material) 130 of a thermosetting resin on the printed circuit board 120 in advance. This filler 130 is positioned between the conductor patterns 122 as shown in FIG. 4.

Figure 5:
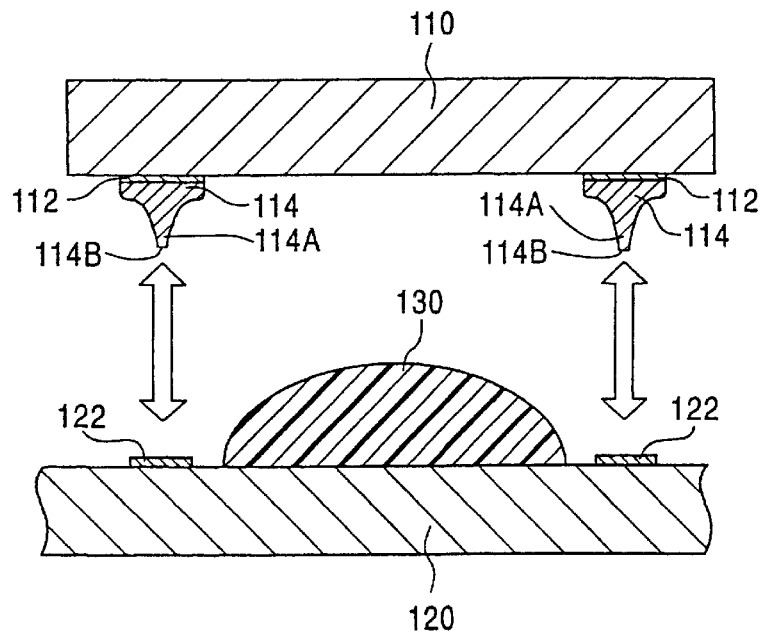
FIG. 5 is a schematic cross sectional view showing a positioning step for positioning the semiconductor device in FIG. 1 and the printed circuit board in FIG. 4.

FIGS. 5 to 6 show processes for mounting the semiconductor device 110 on the printed circuit board 120 in facedown condition. As shown in FIG. 5, at first, each bump electrode 114 of the semiconductor device 110 and the conductor pattern 122 of the printed circuit board 120 are positioned against each other. Then the semiconductor device 110 is moved slowly toward the printed circuit board 120, and thereby the top surface 114B of the bump electrode 114 is depressed against the conductor pattern 122 of the printed circuit board 120. In this condition, a load weight is added to the semiconductor device 110 to move it toward the printed circuit board 120, and simultaneously the bump electrode 114 is heated up to a predetermined temperature to soften it. Resultantly as shown in FIG. 6, each tip 114A of the bump electrode 114 is gradually depressed and transformed, after that the bump electrode 114 and the conductor pattern 122 are joined each other. In this process, the tip 114A of the bump electrode 114 is moved slowly toward the conductor pattern 122 at a speed of 0.1 mm/sec., for example.

Figure 7A:
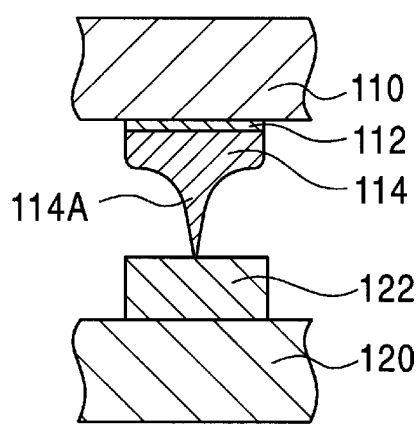
FIG. 7A to FIG. 7C are a series of schematic cross sectional views showing a transforming of a bump electrode in the mounting step.
Figure 7B:
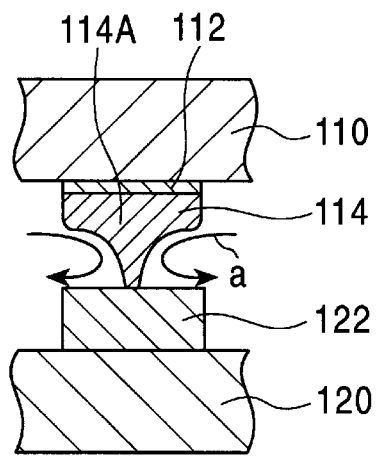
Figure 7C:
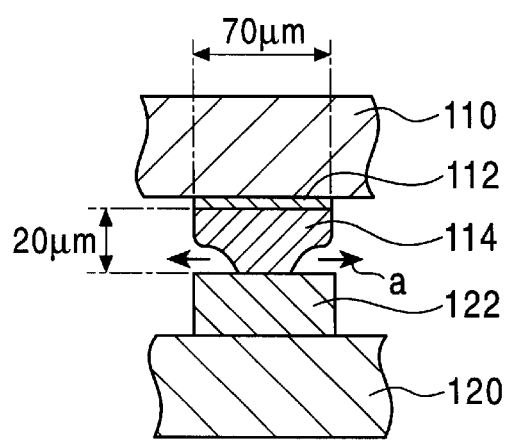

FIGS. 7A to 7C show a series of transforming process of the bump electrode 114 in the mounting process. FIG. 7A shows a step wherein the tip 114A of the bump electrode 114 is contacted with the conductor pattern 122, FIG. 7B shows a step wherein the tip 114A of the bump electrode 114 is started to transform by a load weight and heat, and FIG. 7C shows a step where the bump electrode 114 is depressed enough against the conductor pattern 122 of the printed circuit board 120. As shown in FIGS. 7B and 7C, the transformation of the tip 114A of the bump electrode 114 operates to exclude foreign bodies such as resin particles existed between the bump electrode 114 and the conductor pattern 122 during this process from inside to outside as depicted by arrows a.

As shown in FIG. 7C, by the depression of the bump electrode 114 to the conductor pattern 122, the height of the bump electrode becomes about 20 µm and the diameter becomes about 70 µm, respectively. In this process, the filler 130 placed on the printed circuit board 120 is depressed and spread between the semiconductor device 110 and the printed circuit board 120, and a space between the semiconductor device 110 and the printed circuit board 120 is filled with the filler 130 as shown in FIG. 6. This filler 130 seals the space between the semiconductor device 110 and the printed circuit board 120 in insulating condition. According to the present invention as described above, the tip 114A of the bump electrode 114 and the conductor pattern 122 of the printed circuit board 120 are gradually joined as to exclude foreign bodies such as resin particles, and it is easy to have a good contacting condition between the bump electrode 114 and the conductor pattern 122, and the productivity of final product is improved with high reliability.

Next, a process for mounting a semiconductor device according to one embodiment of the present invention is explained with reference to FIGS. 1 to 7. Firstly, FIG. 1 shows a step for bonding the bump electrode 114 on the semiconductor device 110. As described before, the semiconductor device 110 has a plurality of aluminum electrode pads 112 on the top surface 110A, and the bump electrode 114 is bonded on this aluminum electrode pad 112 of the semiconductor device 120.

FIG. 2 shows a leveling step applied to each tip 114A of the bump electrode 114 as depicted in FIG. 1. As shown in FIG. 2, a brass leveler 132 is placed on the acute tip 114A of the bump electrode 114 as to form a small flat surface 114B at every tip 114A of the bump electrode 114.

In case of this example, the acute tip 114A of the bump electrode 114 is treated a leveling process slightly with a light load weight by a flat surface 132A of a brass leveler 132. Preferably a weight load is N×(4~5) gram-force, where N is the number of the tip 114A of the bump electrode 114 formed on the semiconductor device 110. Each flat surface 114B of the bump electrode 114 has a circular area having a diameter of 5 to 10 µm, resultantly.

Then the semiconductor device 110 provided thus formed the bump electrode 114 with leveled acute tip 114A is mounted on the conductor pattern 122 of the printed circuit board 120. Further there is provided a filler (seal material) 130 of a thermosetting resin on the printed circuit board 120 in advance.

FIG. 5 shows a step for positioning the semiconductor device 110 relative to the printed circuit board 120 in facedown condition. In this positioning step, the bump electrode 114 of the semiconductor device 110 and the conductor pattern 122 of the printed circuit board 120 are positioned each other. Then the semiconductor device 110 is slowly moved towards the printed circuit board 120 so as to contact the small flat surface 110B of the bump electrode 114 with the conductor pattern 122.

FIG. 6 shows a step for mounting the semiconductor device 110 on the printed circuit board 120 with a load weight. In this mounting step, a load weight is added to the semiconductor device 110 to move it toward the printed circuit board 120, and simultaneously the bump electrode 114 is heated up to a predetermined temperature to soften it. Resultantly each tip 114A of the bump electrode 114A is gradually depressed and transformed, and finally the bump electrode 114 and the conductor pattern 122 are joined each other. In this process, the tip 114A of the bump electrode 114 is moved slowly toward the conductor pattern 122 at a speed of 0.1 mm/sec., for example.

As explained before in FIGS. 7A and 7C, the transformation of the tip 114A of the bump electrode 114 operates to exclude foreign bodies such as resin particles existed between the bump electrode 114 and the conductor pattern 122 during this process from inside to outside as depicted by arrows a.

In this step, besides depressed transformation of the bump electrode 114, the filler 130 placed on the printed circuit board 120 is depressed and spread between the semiconductor device 110 and the printed circuit board 120, and a space between the semiconductor device 110 and the printed circuit board 120 is filled with the filler 130 as shown in FIG. 6.

Figure 8:
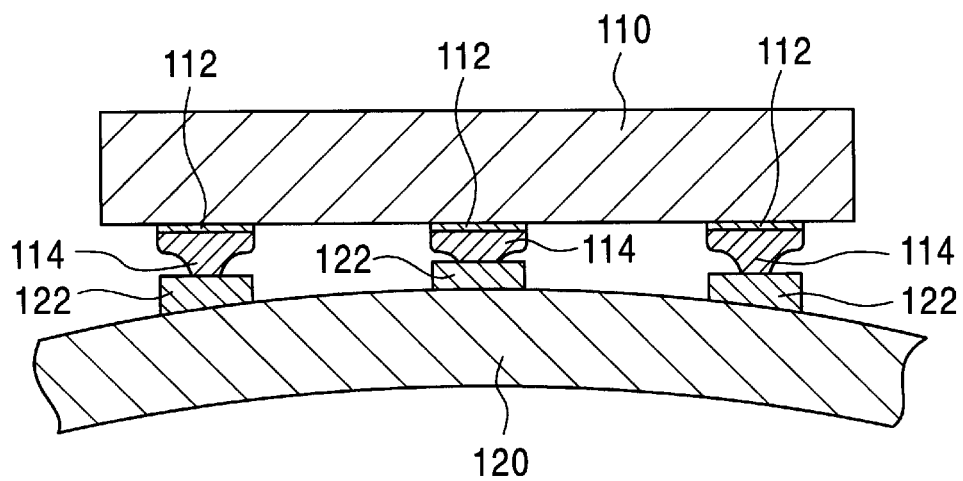
FIG. 8 is a schematic cross sectional view showing a condition where the semiconductor device shown in FIG. 1 is mounted on an up-curved printed circuit board.
Figure 9:
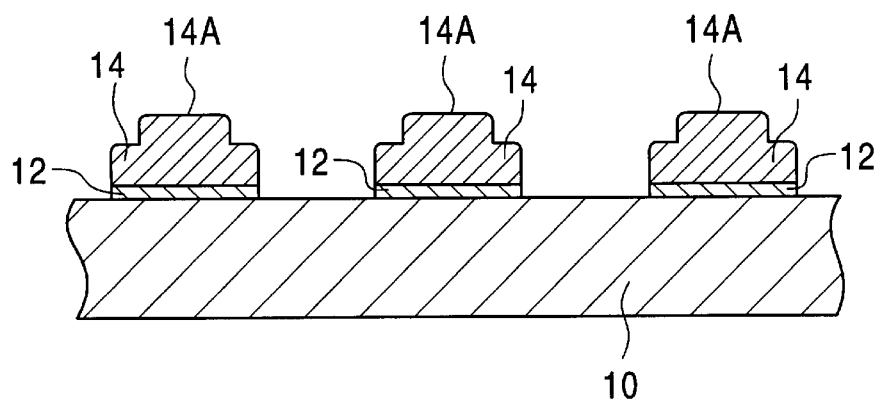
FIG. 9 is a schematic cross sectional view showing one example of a conventional semiconductor device having a plurality of bump electrodes.
Figure 10:
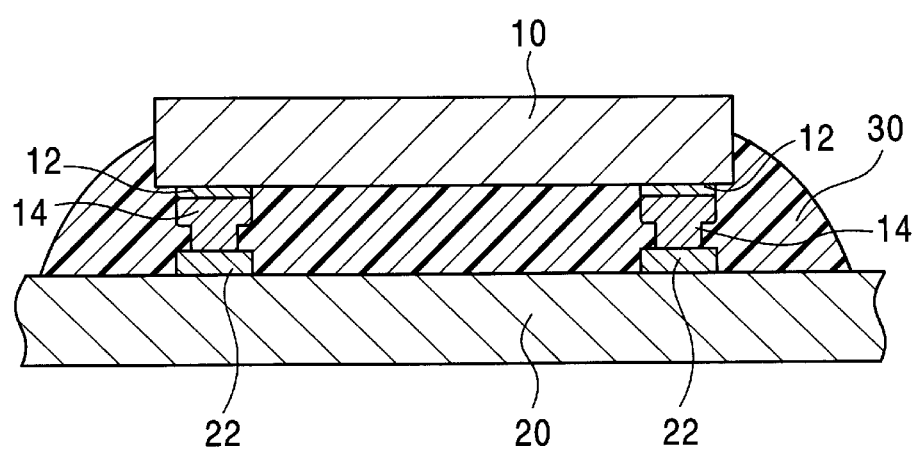
FIG. 10 is a schematic cross sectional view showing a printed circuit board on which the semiconductor device as shown in FIG. 9 is mounted.

Thus according to the mounting process of the present invention, the acute tip 114A of the bump electrode 114 is joined to the conductor pattern 122 of the printed circuit board 120 while excluding foreign bodies during the mounting process, it is easily obtain good contact relation between the bump electrode 114 and the conductor pattern 122. Further in this embodiment, the bump electrode 114 is transformed during the mounting process, so that even if the printed circuit board 120 has a little bend as shown in FIG. 8, it is easy to obtain good contact relation between the bump electrode 114 of the semiconductor device 110 and the conductor pattern 122 of the printed circuit board 120.

While we have described and shown the particular embodiments of our invention, it will be understood that many modifications may be made without departing from the spirit thereof, and we contemplate by the appended claims to cover any modifications as fall within the true spirit and scope of our invention.

What is claimed is:

1. A process of mounting a semiconductor device onto a mounting substrate, said process comprising:

bonding a plurality of bump electrodes onto respective electrode pads, each bump electrode having an acute tip facing away from the respective electrode pad, each tip defined by tapered sides;

leveling all of said tips so that said tips result in flat surfaces laying substantially in a same plane;

positioning said semiconductor device over said mounting substrate so that each of said tips is in registry with a respective portion of a conductor pattern on said mounting substrate, said respective portion of said conductor pattern being resin free;

bringing said semiconductor device and said substrate together so that said tip comes into contact with the respective portion of said conductor pattern;

simultaneously with said step of bringing said semiconductor device and said substrate together, heating said bump electrodes to a predetermined temperature to soften said bump electrodes; and moving said semiconductor device toward said mounting substrate such that said bump electrodes are depressed and transformed and said bump electrodes and said conductor pattern are joined.

2. The process of claim 1, comprising the steps of:

providing sealing resin on said mounting substrate other than on said respective portion of said conductor pattern; and allowing said resin to flow around each of said tips after each of said tips has made contact with the respective portion of said conductor pattern.

3. The process of claim 1, wherein each of said tips is brought into contact with the respective portion of said conductor pattern without any foreign matter between a tip and the respective portion of said conductor pattern.

4. The process of claim 1, wherein each of said tips is cone-shaped when first making contact with the respective portion.

* * * * *